United States Patent [19]
Watanabe

[11] Patent Number: 6,074,939
[45] Date of Patent: Jun. 13, 2000

[54] METHOD FOR FABRICATING SEMICONDUCTOR DEVICE

[75] Inventor: Susumu Watanabe, Tokyo, Japan

[73] Assignee: NEC Corporation, Tokyo, Japan

[21] Appl. No.: 09/030,775

[22] Filed: Feb. 26, 1998

[30] Foreign Application Priority Data

Feb. 27, 1997 [JP] Japan ................................ 9-044132

[51] Int. Cl.[7] ............................................ H01L 21/8247
[52] U.S. Cl. .................... 438/596; 438/446; 438/622; 438/643; 438/644
[58] Field of Search .................... 438/622, 642, 438/643, 644, 445, 446, 596

[56] References Cited

U.S. PATENT DOCUMENTS 5,605,867  2/1997  Sato et al. ............................ 437/235

FOREIGN PATENT DOCUMENTS 7-45605   2/1995  Japan .
7-263690  10/1995  Japan .
8-8248    1/1996  Japan .
8-115910  5/1996  Japan .

OTHER PUBLICATIONS

Wolf, Silicon Processing for the VLSI Era, vol. II, p. 232, 1990.

*Primary Examiner*—Chandra Chaudhari
*Assistant Examiner*—Lisa Kilday
*Attorney, Agent, or Firm*—Sughrue, Mion, Zinn, Macpeak & Seas, PLLC

[57] ABSTRACT

It is an object of the invention to improve reliability of wiring layers in a semiconductor device comprising an intermetal insulator layer composed of a polysilazane SOG layer. A method for fabricating semiconductor device comprises the steps of forming a wiring layer provided with a oxidization-resisting metallic layer covering its outer surface on an underlying insulator layer, which is formed on a semiconductor substrate, forming a side wall insulator layer with penetration-resisting property against oxidizing gas around a wiring layer and the oxidization-resisting metallic layer, applying spin-on glass (SOG)-producing materiel composed of silicon compound materiel, which comprises silazane bonding in its back bone, thereon, and sintering the SOG-producing material in oxidization gas atmosphere.

9 Claims, 7 Drawing Sheets

- 7
- 6 OXIDIZATION-RESISTING METALLIC LAYER
- 9 POLYSILAZANE SOG LAYER
- 8 CVD-SiO₂ LAYER
- 2 UNDERLYING INSULATOR LAYER
- 1 Si-SUBSTRATE
- 7 SIDE WALL INSULATOR LAYER
- 5 FIRST WIRING LAYER

- 10 THROUGH HOLE
- 9
- 8
- 6

- 9  7  6  10  7
- 11 SECOND WIRING LAYER
- 9
- 2
- 1
- 5

METHOD FOR FABRICATING SEMICONDUCTOR DEVICE

FIELD OF THE INVENTION

The invention relates to a method for fabricating a semiconductor device, and particularly to a method for forming an intermetal dielectric layer by using inorganic thick film spin-on glass (SOG, hereinafter).

BACKGROUND OF THE INVENTION

Due to the recent tendency for semiconductor elements to become small, it becomes indispensable to develop minute multi-layered wirings for fabricating a semiconductor device. Consequently. it is now very important to flatten the surface of an intermetal dielectric layer of a semiconductor device having multi-layered wirings.

Moreover, if there is difference in level on the surface of the intermetal dielectric layer, a minute resist pattern for forming a wiring layer thereon cannot be made up because of insufficiency of focus-margin in photolithography. Even when the resist pattern can be made up by chance, there arise the breaking of the wire in the wiring layer and a non-etched portion of the wiring materiel at the point of difference in level. Accordingly, it is necessary to flatten the surface of the intermetal dielectric layer Accordingly, the SOG layer is used as the intermetal dielectric layer to improve various aspects of the semiconducter. However, inorganic SOG, which is composed of four member ring siloxsane functional groups, and organic SOG, which is composed of three member ring siloxsane functional groups comprising methyl or ethyl radicals, have been used as such SOG layers. However, inorganic SOG is apt to be cracked in thermal treatment and organic SOG is apt to be cracked-resisting properties, but methyl or ethyl radicals are deteriorated, when exposed to oxygen plasma.

In recent years, SOG comprising silazane bondings in its backbone (polysilazane SOG, hereinafter) was developed as SOG having crack-resisting and oxygen plasma-resisting properties, and disclosed in Japanes Patent Kokai 5-243223. This SOG is sintered in an oxidizing atmosphere, such as water vapor, releases amino-compound gas, such as ammonia, and is converted into an oxidized layer with high quality.

However, when the processed substrate in sintered, the wiring layer composed of aluminum, etc. is corroded by water vapor (sintering atmosphere gas) or amino-compound gas, and reliability of the wiring layer is noticeably degraded. Under excess oxidization treatment, oxidizing gas penetrates the intermetal dielectric layer, which is ordinarily porous, and even the surface of a silicon substrate is oxidized.

Thereupon, in order to prevent corrosion of the aluminum wiring layer, water absorption treatment or ultraviolet irradiation is applied to the surface of the polysilazane SOG layer in the process of sintering. This method is disclosed in Japanese Patent Kokai No. 7-45605 in detail. Moreover, a method for depositing a silicon nitride layer (a SiN layer, hereinafter) or a silicon oxinitride layer (a SiON layer, hereinafter) with high passivation effect on the wiring layer is disclosed in Japanese Patent Kokai 8-115910. In this structure, the passivation layer isolates water vapor (sintering atmosphere gas) and amino-compound gas (out gas) from the wiring layer.

In a semiconductor device disclosed in Japanese Patent Kokai 8-11590, an underlying insulator layer is formed on a silicon substrate, and the first wiring layer is formed on the underlying insulator layer. The first wiring layer is composed of aluminum. Next, a SiON layer is so formed that the whole surfaces of the first wiring layer and the underlying insulator layer are covered with the SiON layer. The SiON layer is deposited by a chemical vapor deposition method in a plasmic atmosphere. Next, polysilazane SOG application is applied to the whole surfaces of the first wiring layer on the underlying insulator layer. Then, the processed substrate is sintered and a polysilazane SOG layer is formed. Next, a through hole is formed on a predetermined region on the polysilazane SOG layer and the SiON layer, through which the second wiring layer formed on the top surface of the polysilazane SOG layer is electrically connected with the first wiring layer.

However, according to the method disclosed in Japanese Patent Kokai No. 7-45605, it is difficult to sufficiently oxidize the polysilazane SOG layer. Then, it becomes difficult to obtain a dense oxidized layer with high quality serving as an intermetal dielectric layer. Especially, when the polysilazane SOG layer is thick, quality of its interior part is degraded.

If the period of sintering is elongated in order to sufficiently oxidize the polysilazane SOG layer, the surface of the wiring layer is corroded by oxidizing gas, and reliability of the wiring layer is noticeably degraded.

According to the technology disclosed in Japanese Patent Kokai 8-115910, the SiON layer serving as the passivation layer is formed between the first wiring layer and the second wiring layer. It should be noted that the dielectric constant of the passivation layer is considerably higher than that of a silicon oxide layer. Accordingly, parasitic capacitance between the wiring layers increases, which checks the improvement of speed of data-processing of the semiconductor device. This problem becomes noticeable as the structure of the wiring layer becomes minute.

Moreover, in an ordinary method for fabricating a semiconductor device, thermal treatment is applied to a processed substrate in a hydrogen atmosphere after wiring layers are formed. This process is indispensable in order to stabilize the characteristics of a MOS transistor. By the above mentioned thermal treatment, non-bonded sites on a boundary surface between the insulator layer of the MOS transistor and the silicon substrate are terminated by hydrogen.

Moreover, if the passivation layer is formed on the whole surfaces of the wiring layer and the underlying layer as in the case of the technology shown in Japanese Patent Kokai 8-115910, thermal treatment of the processed substrate in hydrogen atmosphere is not effectual, and the characteristics of the MOS transistor cannot be stabilized. The reason is that the passivation layer obstructs penetration of hydrogen into the interior region of the processed substrate.

SUMMARY OF THE INVENTION

Accordingly, it is an object of the invention to solve the aforementioned problems related to the sintering process of the polysilazane SOG layer, improve reliability and performance of the wiring layers, and provide a method for fabricating a semiconductor device, which can cope with the recent tendency that the minute and multi-layered wiring layers are being introduced.

According to the feature of the invention, a method for fabricating a semiconductor device comprises the steps of:
   forming an underlying insulator layer on a substrate,
   forming a metallic wiring layer on the underlying insulator layer, forming an oxidization-resisting metallic layer on the metallic wiring layer, removing the oxidization-resisting metallic layer and the metallic wiring layer except a predetermined part on the underlying insulator layer, forming a side wall insulator layer with penetration-resisting property against oxidizing gas around the oxidization-resisting metallic layer and the metallic wiring layer on the predetermined part, forming a silicon oxide layer over the oxidization-resisting metallic layer, the side wall insulator layer and the underlying insulator layer, applying spin-on glass (SOG, hereinafter) application composed of silicon compound material, which comprises silazane bondings in its back bone, on the silicon oxide layer, and sintering said SOG application in oxidizing gas atmosphere.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a method for fabricating a semiconductor device in preferred embodiments according to the invention, the aforementioned conventional method for fabricating a semiconductor device will be explained referring to FIG. 1.

The technology disclosed in Japanese Patent Kokai 8-15910 will be explained Deferring to FIG. 1. FIG. 1 is a cross-sectional view for showing wiring layer of the semiconductor device. In this case, the second wiring layer is formed by an ordinary method.

Figure 1:
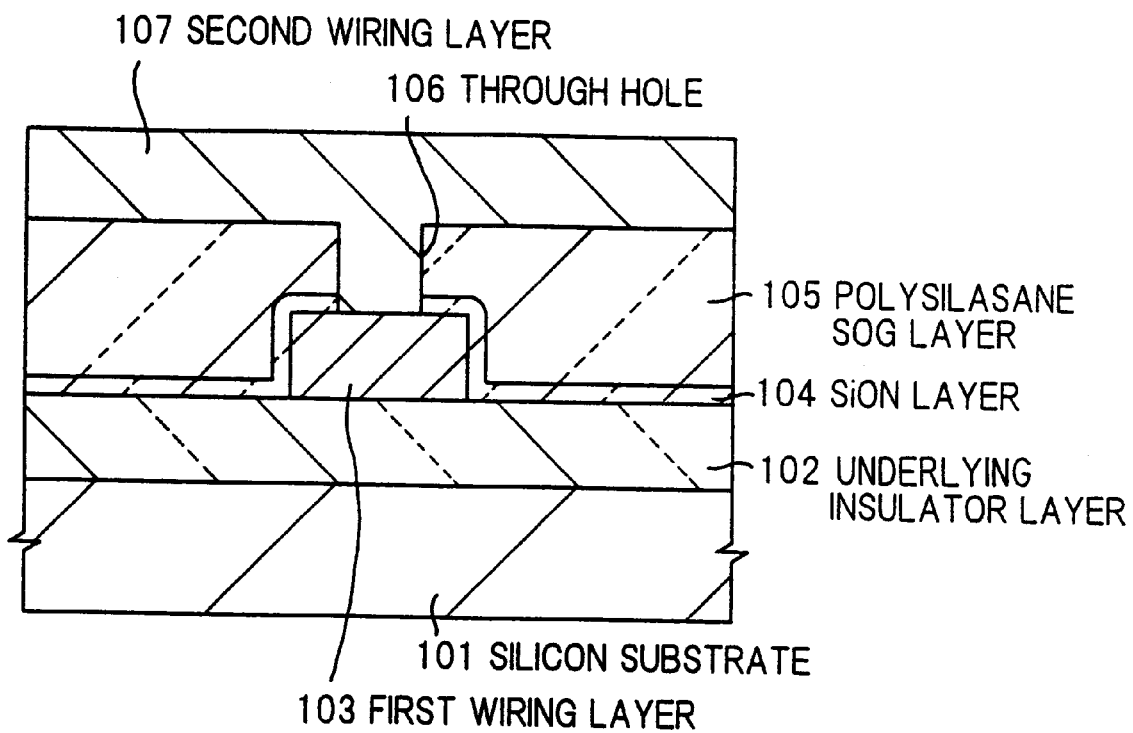
FIG. 1 is a cross-sectional view of wiring layers for explaining a conventional technology.

As shown in FIG. 1, an underlying insulator layer 102 is formed on a silicon substrate 101. Then, the first wiring layer 103 is formed on the underlying insulator layer 102. The first wiring layer 103 is composed of aluminum.

Next, a SiON layer 104 is so formed that the whole surfaces of the first wiring layer 103 and the underlying insulator layer 102 are covered with the SiON layer 104. The SiON layer 104 is deposited by a chemical vapor deposition method in plasmic atmosphere (a plasma-CVD method).

Next, SOG application is composed of silicon compound material, which comprises silazane bondings in its backbone and is terminated by hydrogen at both ends of a molecule. Then, SOG application is sintered in oxidizing atmosphere or water vapor atmosphere, and a SOG layer 105, a polysilazane SOG layer, is formed. In this case, the processed substrate is quickly taken into and out from a sintering furnace. The surface of the SOG layer 105 thus obtained is flattened.

Next, an opening is made in a predetermined region of the SOG layer 105 and the SiON layer 104, and a through hole 106 reaching the first wiring layer is formed. Then, the second wiring layer 107, which is connected with the first wiring layer 103 via the through hole 106, is allocated on the surface of the SOG layer 105.

In this way, the polysilazane SOG layer is formed between the wiring layers, and a wiring structure with a flattened intermetal dielectric layer can be obtained.

The disadvantages of this structure have been mentioned in the above.

Next, the first preferred embodiment will be explained based on FIGS. 2A to 2C and FIGS. 3A to 3C.

Figure 2A:
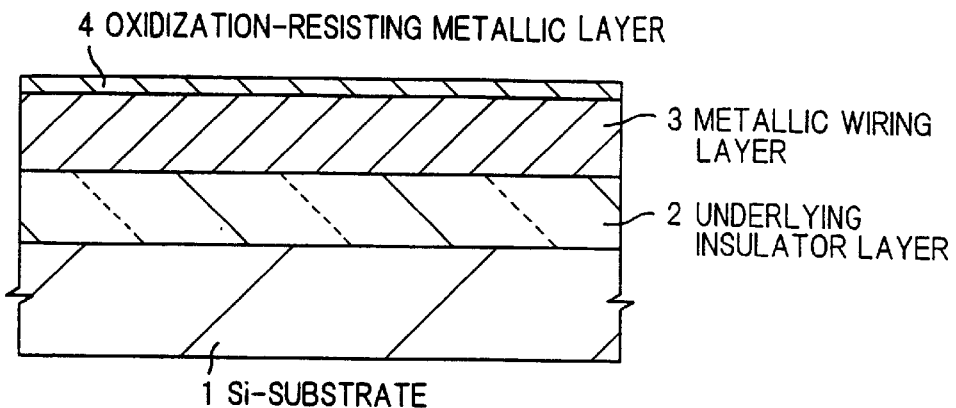
FIGS. 2A to 2C are cross-sectional views for explaining the first preferred embodiment of the invention shown in regular sequence of the fabrication process.

As shown in FIG. 2A, an underlying insulator layer 2 is formed on a Si-substrate 1 as a foundation of wiring layers. The underlying insulator layer 2 is $SiO_2$ layer about 1 $\mu$m thick which is deposited by a CVD method. A metallic wiring layer 3 is formed on the underlying insulator layer 2. The metallic wiring layer 3 is composed of Al or an alloy of Al and Cu, which is 500 to 1000 $\mu$m thick and deposited by a well-known spattering method. Moreover, an oxidization-resisting metallic layer 4 is deposited on the metallic wiring layer 3. The oxidization-resisting metallic layer 4 is composed of a 30 to 100 $\mu$m thick TiN layer.

Figure 2B:
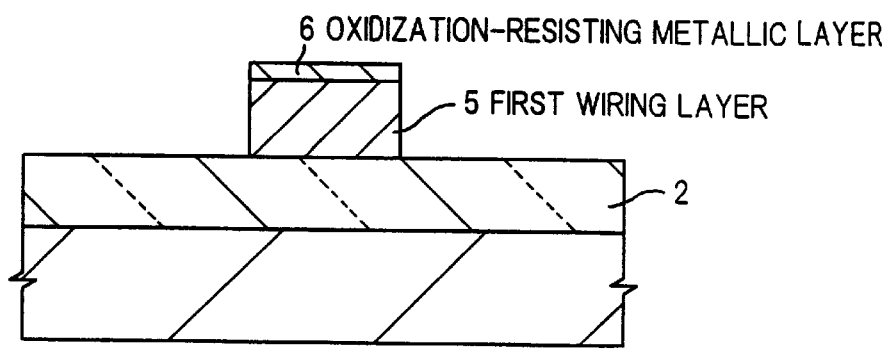

Next, as shown in FIG. 2B, the deposited metallic layers are processed by means of photolithographic and dry-etching technologies, and thereby the first wiring layer 5 and the oxidization-resisting metallic layer 6 are formed.

Next, a SiON or SiN layer is deposited over the whole surface of the processed substrate. The thickness of the aforementioned insulator layer is 100 to 200 $\mu$m, which is anisotropically dry-etched. That is to say, the SiON or SiN layer is etched back.

Figure 2C:
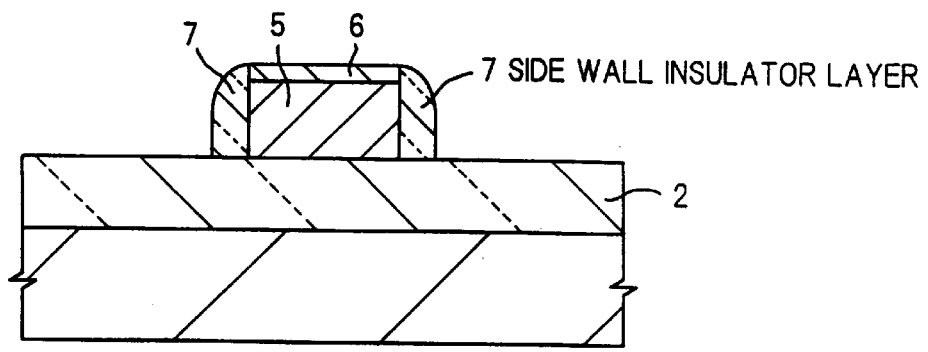

In this case, reaction gas, which etches the SiON or SiN layer with high speed, but slowly etches the $SiO_2$ layer, is used as etching gas. For example, a mixture of $NF_3$ and $O_2$ is used as the reaction gas. As shown in FIG. 2C, a side wall insulator layer 7 is formed on side walls of the first wiring layer 5 and the oxidization-resisting metallic layer 6. The side wall insulator 7 is composed of passivation material, such as SiON or SiN.

Figure 3A:
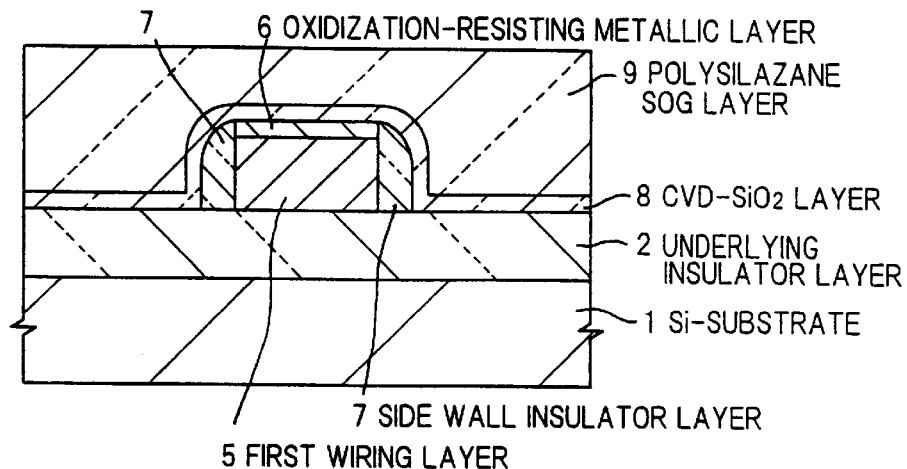
FIGS. 3A to 3C are cross-sectional views for explaining the second preferred embodiment of the invention shown in regular sequence of the fabrication process.

Next, as shown in FIG. 3A, a $CVD-SiO_1$ layer 8, which covers the underlying insulator layer 2, the oxidization-resisting metallic layer 6 and the side wall insulator layer 7, is deposited by well-known CVD method. The thickness of the $CVD-SiO_2$ layer 8 is about 100 $\mu$m.

Subsequently, polysilazane SOG application is applied to the top surface of the processed substrate so that it is 500 to 1000 $\mu$m thick. Next, thermal treatment of 100 to 200° C. is applied thereto, then organic solvent is evaporated, and finally polysilazane SOG is produced.

Next, polysilazane SOG is sintered, and a polysilazane SOG layer 9 is formed as shown in FIG. 3A. Polysilazane SOG is sintered at a temperature of 400° C. for 30 to 60 min in a diffusion furnace. In the invention, mixed gas, which is obtained by adding a small amount of water vapor to oxygen, is used as atmosphere gas for sintering.

Figure 4:
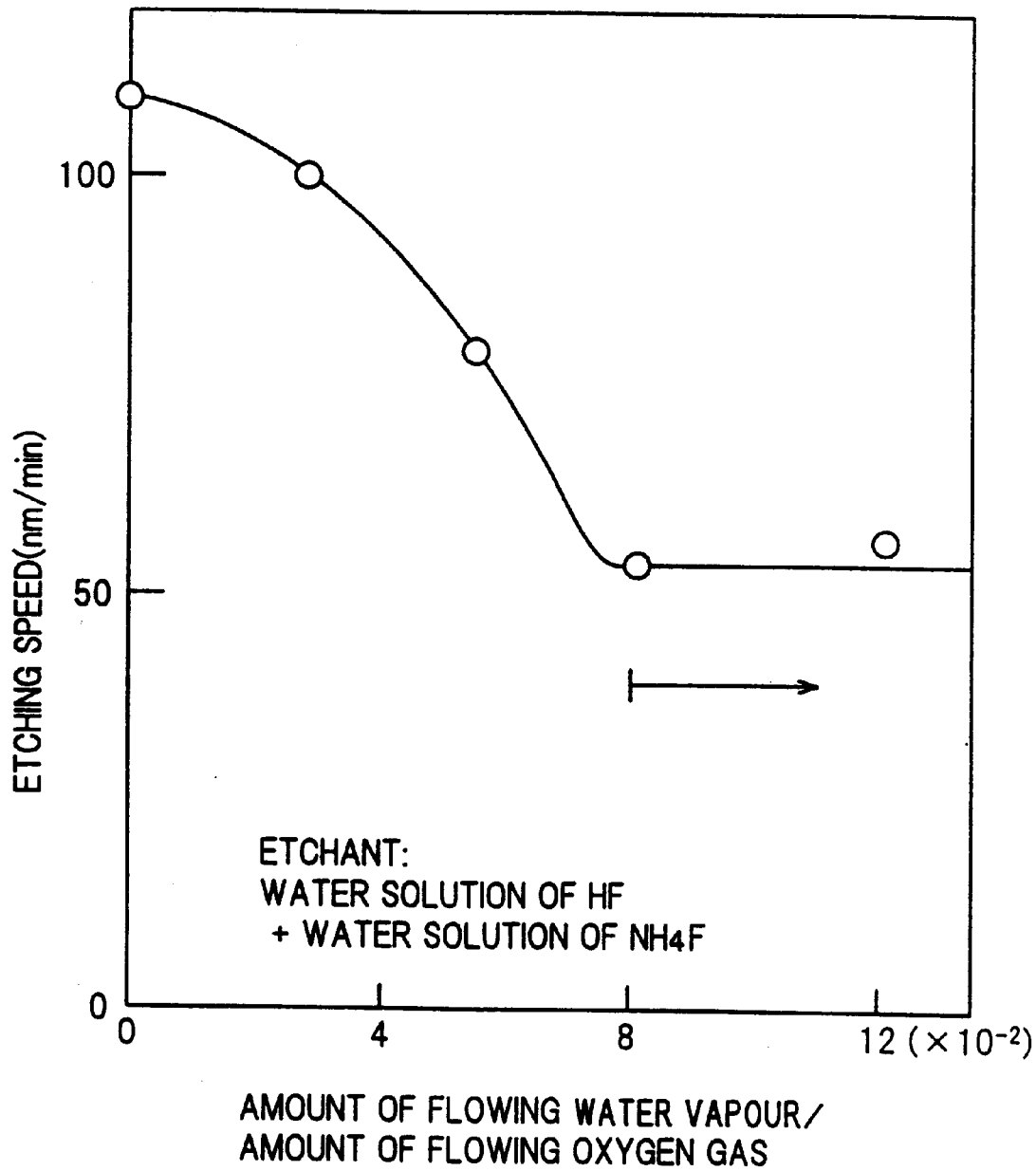
FIG. 4 is a diagram for explaining fabrication conditions of a SOG layer in the embodiment of the invention.

Next, explanation on this atmosphere gas will be given referring to FIG. 4. FIG. 4 is a diagram for showing a relation between etching speed of the sintered polysilazane SOG layer and the amount of water vapor added to sintering atmosphere gas, where etching of the polysilazane SOG layer is carried out in mixture of water solution of HF and that of $NH_4F$. Further, etching speed of a $SiO_2$ layer produced by normal plasmic-CVD method is 40 to 50 μm/min. Similarly, etching speed of a SOG layer produced from inorganic SOG composed of four member siloxane functional group is 100 μm/min.

As shown in FIG. 4, when the sintering atmosphere is pure oxygen, the etching speed of polysilazane is 110 μm/min, a high value. However, when water vapor is added to oxygen, etching speed decreases. That is to say, in case that the ratio of the amount of flowing water vapor to the amount of flowing oxygen is less than $8 \times 10^{-2}$, etching speed decreases as the amount of flowing water vapor increases. In case that this ratio is larger than $8 \times 10^{-2}$, etching speed of the polysilazane SOG layer becomes stable and remains nearly constant.

The decrease of etching speed of the polysilazane SOG layer is attributed to the quality of the surface of the sintered layer. FIG. 4 shows that it is desirable that the ratio of the amount of flowing water vapor to the amount of flowing oxygen is kept above $8 \times 10^{-2}$ in case that water vapor is added to oxygen for sintering polysilazane SOG.

In the process of sintering, the first wiring layer 5 is perfectly protected by the oxidization-resisting metallic layer 6 and the side wall insulator 7 from oxidizing gas, namely oxygen, to which a small amount of water vapor is added. Accordingly, the first wiring layer 5 is never corroded.

Figure 3B:
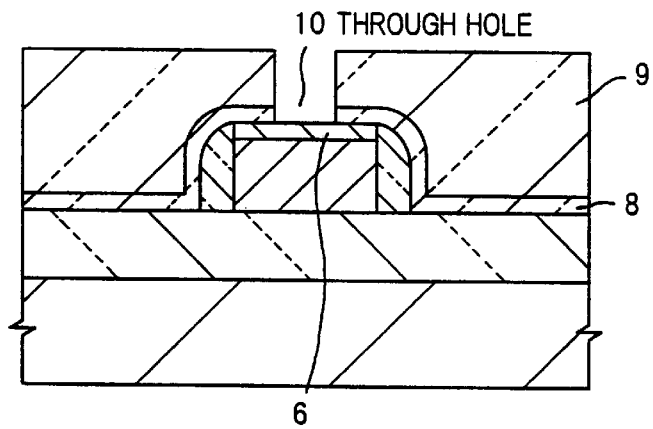
Figure 3C:
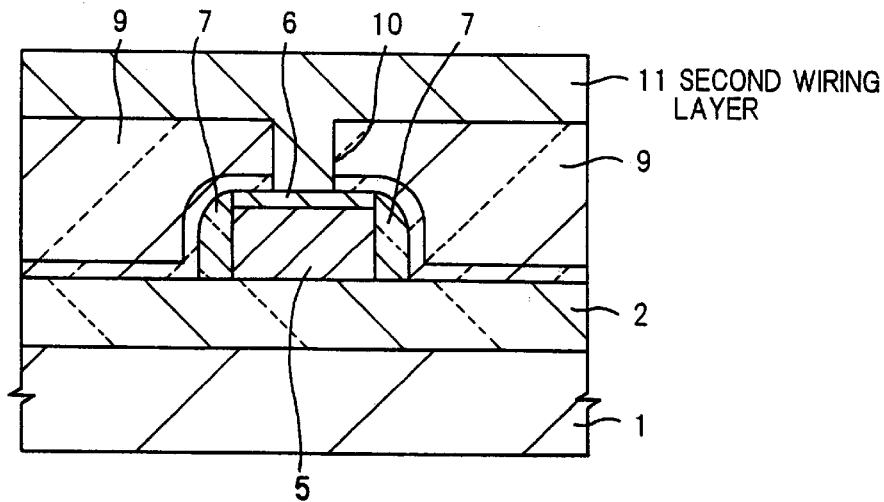

Next, an opening is made on a predetermined region on the polysilazane SOG layer 9 and the CVD-$SiO_2$ layer 8 by means of photolithographic and dry-etching technologies. In this way, a through hole 10, which reaches the surface of the oxidization resisting metallic layer 6, is formed as shown in FIG. 3B.

Then, the second wiring layer 11, which is connected with the oxidization-resisting metallic layer 6 on the first wiring layer 5 via the through hole 10, is allocated on the surface of the polysilazane SOG layer 9.

As mentioned in the above, the first wiring layer 5 is formed on the Si-substrate 1 via the underlying insulator layer 2, then the flattened polysilazane SOG layer 9 is formed over the CVD-$SiO_2$ layer 8, and finally the second wiring layer 11 is formed on the polysilazane SOG layer 9. Thus, the double layered wiring structure can be completed. The surface of the first wiring layer 5 is perfectly protected by the oxidization-resisting metallic layer 6 and the side wall insulator layer 7.

As mentioned in the above, the wiring layers with high reliability can be obtained. Moreover, a SiON or SiN layer having passivation effect is formed only on the side wall of the first wiring layer. Thus, parasitic capancitances between wiring conductors can be decreased. Moreover, since the SiON or SiN layer is not formed on the underlying insulator layer 2, stabilization of MOS transistors by means of thermal treatment in hydrogen atmosphere can be easily carried out.

Next, the second preferred embodiment will be explained referring to FIGS. 5A to 5C and FIGS. 6A to 6C. FIGS. 5A to 5C and FIGS. 6A to 6C are schematic cross-sectional views for showing the fabrication process according to the invention in regular sequence. It should be noted that the structural elements explained in the first preferred embodiment will be denoted by the same reference numerals as those in FIGS. 2A to 2C and FIGS. 3A to 3C.

Figure 5A:
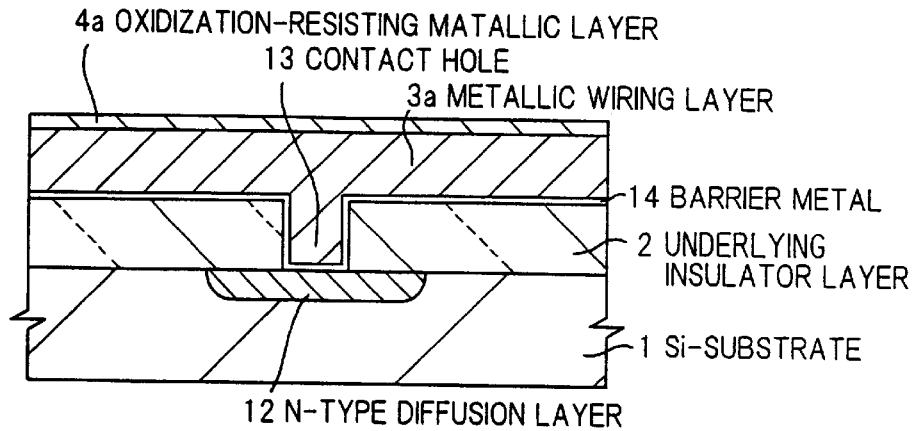
FIGS. 5A to 5C are cross-sectional views for explaining the second preferred embodiment of the invention shown in regular sequence of the fabrication process.

As shown in FIG. 5A, an N-type diffusion layer 12 is formed in a predetermined region on a P-type Si-substrate 1. A 500 μm thick underlying insulator layer 2 is formed so that the whole top surface of the Si-substrate 1 is covered with the underlying insulator layer 2.

Then, an opening is made in a predetermined region on the underlying insulator layer 2, and a contact hole 13, which reaches the diffusion layer 12, is formed. Next, a barrier metal 14 is deposited on the underlying layer 2 and the inner wall of the contact hole 13 by a spattering method etc., where the barrier metal 14 is composed of an about 50 μm thick TiN layer. Next, a metallic wiring layer 3a is formed on the barrier metal 14. The metallic wiring layer 3a is an about 500 μm thick W layer.

An oxidization-resisting metallic layer 4a is deposited on the metallic wiring layer 3a, where the oxidization-resisting metallic layer 4a is composed of a about 50 μm thick Pt layer.

Figure 5B:
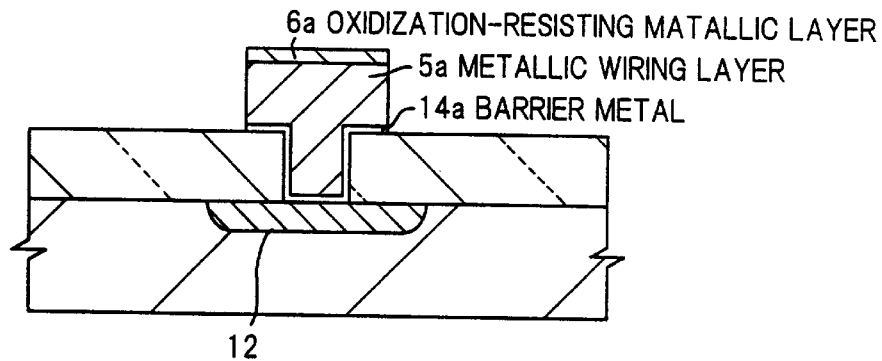

Next, as shown in FIG. 5B, the aforementioned metallic layers are processed by means of photolithographic and dry-etching technologies, and a barrier metal 14a and an oxidization-resisting metallic layer 6a, which are electrically connected with the diffusion layer 12, are formed.

Figure 5C:
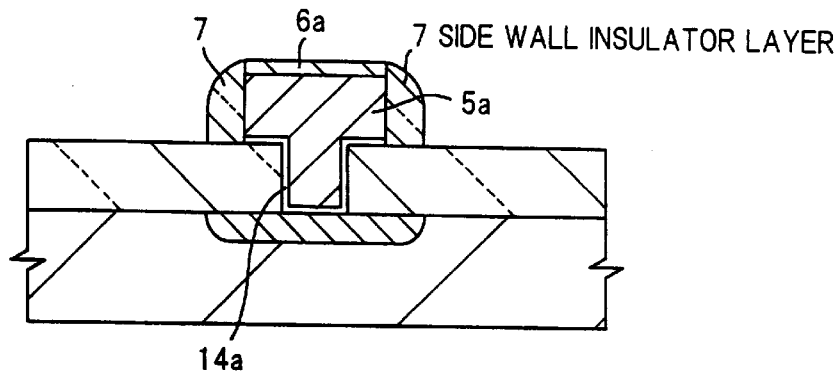

Next, similarly to the case of the first preferred embodiment, a side wall insulator layer 7 is formed around the side walls of the first wiring layer 5a and the oxidization-resisting metallic layer 6a as shown in FIG. 5C. The side wall insulator layer 7 is made of passivation material, such as SiON or SiN.

Figure 6A:
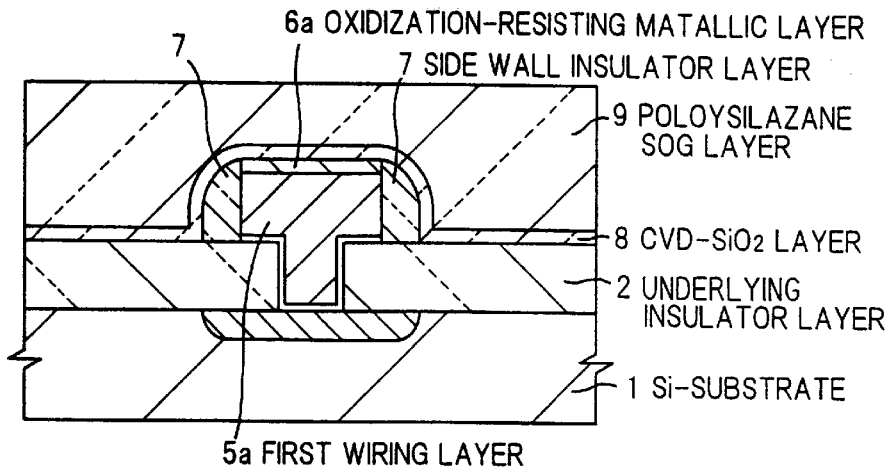
FIGS. 6A to 6C are cross-sectional views for explaining the second preferred embodiment of the invention shown in regular sequence of the fabrication process.

Next, as shown in FIG. 6A, a CVD-$SiO_2$ layer 8, which covers the underlying insulator layer 2, the oxidization-resisting metallic layer 6a and the side wall insulator layer 7, are deposited similarly to the case of the first preferred embodiment.

Next, polysilazane SOG application is applied to the whole top surface of the processed substrate so that it is about 600 μm thick. Then, thermal treatment of about 150° C. is applied thereto and organic solvent is evaporated. Polysilazane SOG is thus formed.

Next, polysilazane SOG is sintered, and polysilazane SOG layer 9 is formed as shown in FIG. 6A. In this case, polysilazane SOG is sintered in a diffusion furnace at 600° C. for 10 min. Similarly, to the case of the first preferred embodiment, a mixed gas, which is obtained by adding a small amount of water vapor to oxygen, is used as atmosphere gas for the sintering process. In this case, the processed substrate is taken into and out from the furnace in oxygen atmosphere in order to prevent occurrence of cracks on the polysilazane SOG layer.

In the process of sintering, the first wiring layer 5a is perfectly protected by the oxidization-resisting metallic layer 6a and the side wall insulator layer 7 from oxidizing gas, that is to say, oxygen, to which a small amount of water vapor is added. Then, the first wiring layer 5a is never corroded.

Figure 6B:
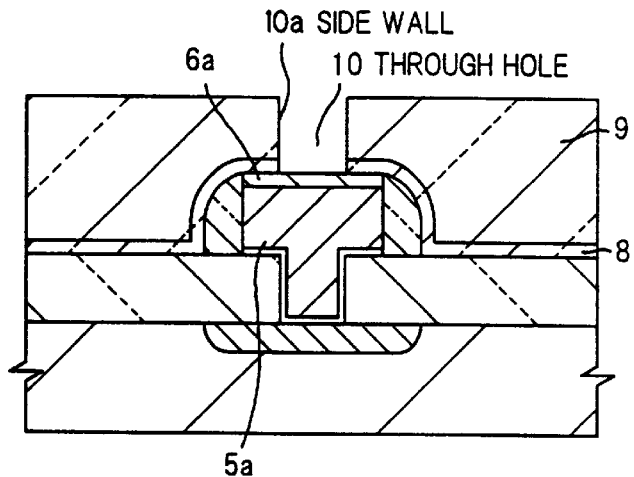

Next, similarly to the case of the first preferred embodiment, an opening is made on the polysilazane SOG layer 9 and the CVD-$SiO_2$ layer 8 as shown in FIG. 6B, and a through hole 10, which reaches the surface of the oxidization-resisting metallic layer 6a, is formed.

Then, the processed substrate is again sintered under the same conditions as that in the case of the aforementioned polysilazane SOG-sintering. In this process of sintering, the polysilazane SOG layer on the side wall 10a of the through hole 10 is exposed to oxidizing atmosphere. The polysilazane SOG layer on the side wall 10a of the through hole is converted into a high quality SiO$_2$ layer. Since the oxidization-resisting metallic layer 6a is composed of a Pt layer, its surface is never oxidized in the sintering process.

Figure 6C:
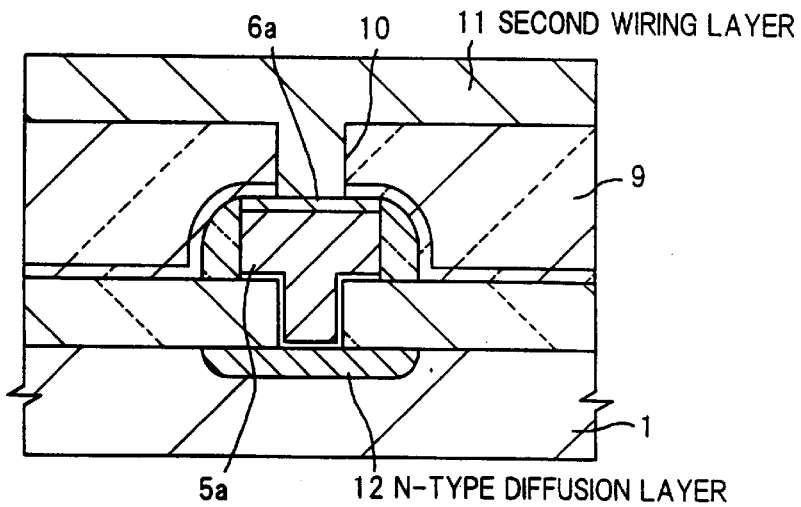

Next, as shown in FIG. 6C, the second wiring layer 11, which is connected to the oxidization-resisting metallic layer 6a on the first wiring layer 5a via this through hole 10, is allocated on the surface of the polysilazane SOG layer 9.

As mentioned in the above, the first wiring layer 5a and the oxidization-resisting metallic layer 6a, which are connected with the diffusion layer 12 on the Si-substrate 1, is formed. Moreover, the flattened polysilazane SOG layer 9 is formed thereover, and the second wiring layer 11, which is connected with the oxidization-resisting metallic layer 6a, is formed. A double layered wiring structure is thus completed.

The side wall 10a of the through hole 10 on the polysilazane SOG layer 9 is converted into the high quality SiO$_2$ layer, Accordingly, corrosion of the second wiring layer 11, which has been caused by out gas from the side wall of the through hole in the conventional structure is eliminated. Moreover, the similar effect to that obtained by the first preferred embodiment can be achieved.

Figure 7A:
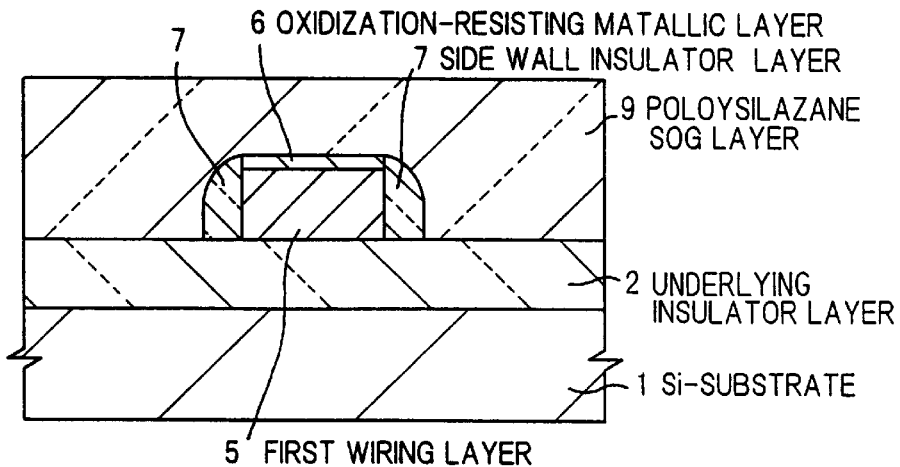
FIGS. 7A to 7C are cross-sectional views for explaining the third preferred embodiment of the invention.
Figure 7B:
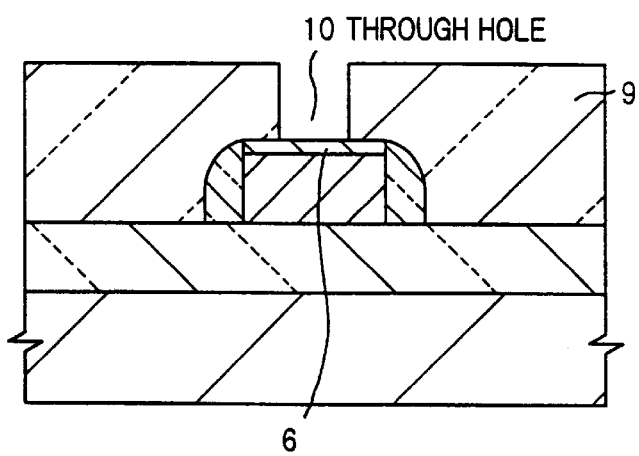
Figure 7C:
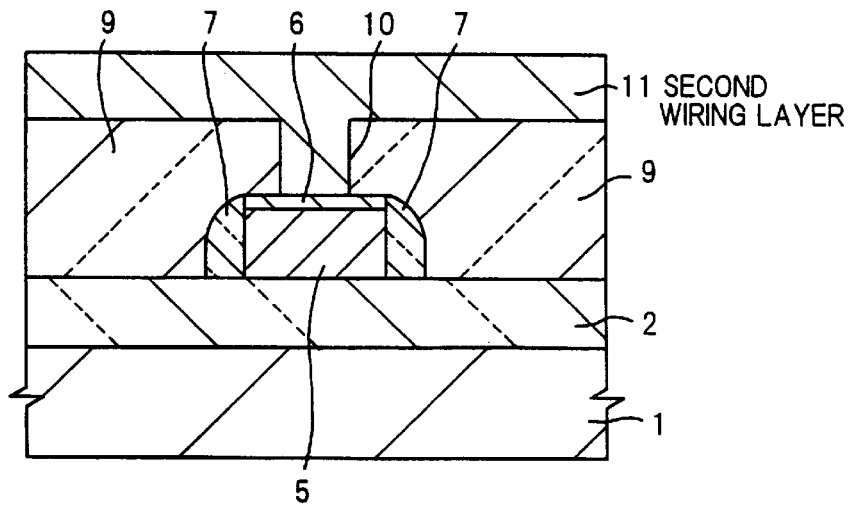

In the aforementioned embodiment, the CVD-SiO$_2$ layer 8, which covers the underlying insulator layer 2 and the side wall insulator layer 7, is formed. However, the CVD-SiO$_2$ layer 8 is not necessarily required, and the polysilazane SOG layer 9 may be directly formed on the underlying insulator layer 2 shown in FIGS. 3A to 3C. FIGS. 7A to 7C show the third preferred embodiment of the invention, in which the CVD-SiO$_2$ layer are omitted in the steps shown in FIGS. 3A to 3C.

Moreover, according to the invention, the similar effect can be achieved in case that the wiring layer is composed of Al. an alloy of Al and Cu or metal, which is other than W and not resisting against O$_2$ or NH$_4$OH gas, also.

As mentioned in the above, according to the method for fabricating a semiconductor device according to invention, a side wall insulator layer with a penetration-resisting property against oxidizing gas is formed around the side wall of the wiring layer, which is provided with the oxidization-resisting metallic layer on its outer surface. Then, the SOG-producing material composed of the silicon compound material, which has silazane bondings in its back bone, is applied to the processed substrate, which is sintered in oxidizing gas atmosphere, and the polysilazane SOG layer is produced. In this case, oxygen gas, to which a small amount of water vapor is added, is used as oxidizing gas.

Accordingly, the wiring layer is never corroded, and a dense oxidized layer with high quality can be obtained. Moreover, the surface of the silicon substrate is never oxidized in the sintering process.

Furthermore, the passivation layer with high dielectric constant is not formed between the wiring layers, which is distinct from the feature of the conventional technology. The improvement of speed of data processing of the semiconductor device is not obstructed by increase of parasitic capacitance between the wiring layers, even in case that the structure of the wiring layer becomes minute.

According to the method for fabricating the semiconductor device according to the invention, in the process of thermal treatment of the processed substrate in hydrogen atmosphere, the characteristics of the MOS transistors can be sufficiently stabilized.

According to the fabrication process of the semiconductor device according to the invention, the side wall of the through hole in the polysilazane SOG layer becomes the silicon oxide layer with high quality. Accordingly, corrosion of the second wiring layer caused by out gas from the side wall of the through hole, which has very often occurred in the conventional structure, is exterminated.

As mentioned in the above, the method for fabricating the semiconductor device according to the invention improves the reliability of the wiring layer and the performance of the product, and copes with the recent tendency that the structure of the multi-layered wiring layers becomes minute.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for fabricating a semiconductor device comprising the steps of:

forming an underlying insulator layer on a substrate, forming a metallic wiring layer on said underlying insulator layer, forming an oxidization-resisting metallic layer on said metallic wiring layer, removing said oxidization-resisting metallic layer and said metallic wiring layer except a predetermined part on said underlying insulator layer, forming a side wall insulator layer with a penetration resisting property against oxidizing gas on side walls of said oxidization-resisting metallic layer and said metallic wiring layer of said predetermined part, forming a silicon oxide layer over said oxidization-resisting metallic layer, said sidewall insulator layer and said underlying insulator layer, applying spin-on glass (SOG) application composed of silicon compound material, which comprises silazane bondings in its back bone, on said silicon oxide layer, and sintering said SOG application in an oxidizing gas atmosphere.

2. A method for fabricating a semiconductor device according to claim 1, wherein;
   said oxidization-resisting metallic layer is composed of platinum or titanium nitride.

3. A method for fabricating a semiconductor device according to claim 1, wherein;
   said side wall insulator layer is composed of silicon nitride or silicon oxinitride.

4. A method for fabricating a semiconductor device according to claim 1, wherein:
   said metallic wiring layer is composed of aluminum, or an alloy of aluminum and copper or tungsten.

5. A method for fabricating a semiconductor device according to claim 1, wherein:
   said step of sintering said SOG application is carried out in oxygen gas, to which a small amount of water vapor is added.

6. A method for fabricating a semiconductor device according to claim 5, wherein:
   a ratio of an amount of said water vapor to an amount of said flowing oxygen gas is more than $8 \times 10^{-2}$.

7. A method for fabricating a semiconductor device according to claim 1, further comprising the steps of:
   forming a through hole, which reaches said oxidization-resisting metallic layer, on a predetermined portion on a polysilazane SOG layer obtained by said step of sintering said SOG application, and again sintering said polysilazane SOG layer in said oxygen gas, to which a small amount of water vapor is added.

8. A method for fabricating a semiconductor device according to claim 7, wherein:

said step of again sintering said SOG application is carried out under condition that a ratio of an amount of said water vapor to an amount of flowing oxygen gas is more than $8 \times 10^{-2}$.

9. A method for fabricating a semiconductor device comprising the steps of:

forming an underlying insulator layer on a substrate, forming a metallic wiring layer on said underlying insulator layer, forming an oxidization-resisting metallic layer on said metallic wiring layer, removing said oxidization-resisting metallic layer and said metallic wiring layer except a predetermined part on said underlying insulator layer, forming a side wall insulator layer with penetration-resisting property against oxidization gas on side walls of said oxidization-resisting metallic layer and said metallic wiring layer of said predetermined part, forming spin-on glass (SOG) application composed of silicon compound material, which comprises silazane bondings in its back bone, over said oxidization-resisting metallic layer, said side wall insulator layer and said underlying insulator layer, and sintering said SOG application in an oxidization gas atmosphere.

* * * * *

UNITED STATES PATENT AND TRADEMARK OFFICE
CERTIFICATE OF CORRECTION

PATENT NO. : 6,074,939  
DATED : June 13, 2000  
INVENTOR(S) : Susumu Watanabe

Page 1 of 1

It is certified that error appears in the above-identified patent and that said Letters Patent is hereby corrected as shown below:

Column 4,
Line 50, delete "$SiO_1$" insert -- $SiO_2$ --.

Signed and Sealed this

Fourteenth Day of August, 2001

Attest:

NICHOLAS P. GODICI  
Attesting Officer     Acting Director of the United States Patent and Trademark Office